United States Patent [19]
Oishi

[11] Patent Number: 6,002,144
[45] Date of Patent: Dec. 14, 1999

[54] ZENER DIODE SEMICONDUCTOR DEVICE WITH CONTACT PORTIONS

[75] Inventor: Tetsuya Oishi, Kanagawa, Japan

[73] Assignee: Sony Corporation, Japan

[21] Appl. No.: 09/020,894

[22] Filed: Feb. 9, 1998

[30] Foreign Application Priority Data

Feb. 17, 1997  [JP]  Japan .................................. 9-032259

[51] Int. Cl.[6] ........................... H01L 23/48; H01L 23/52; H01L 29/40
[52] U.S. Cl. ........................ 257/106; 257/362; 257/603; 257/751; 257/771
[58] Field of Search .................................. 257/106, 603, 257/771, 751, 362

[56] References Cited

U.S. PATENT DOCUMENTS

| | | | |
|---|---|---|---|
| 3,677,838 | 7/1972 | Brebisson | 148/187 |
| 4,119,440 | 10/1978 | Hile | 148/1.5 |
| 5,648,678 | 7/1997 | Begley et al. | 257/529 |

FOREIGN PATENT DOCUMENTS

| | | | |
|---|---|---|---|
| 2504846 | 8/1975 | Germany | 257/106 |
| 54-6480 | 1/1979 | Japan | 257/106 |
| 54-50277 | 4/1979 | Japan | 257/106 |
| 4-2171 | 1/1992 | Japan | 257/603 |

OTHER PUBLICATIONS

Stephens, "Stable Zener Diode", *IBM Technical Disclosure Bulletin*, vol. 19, No. 5, Oct. 1975, pp. 1782–1783, Oct. 1976.

*Primary Examiner*—William Mintel
*Attorney, Agent, or Firm*—Ronald P. Kananen; Rader, Fishman & Grauer

[57] ABSTRACT

A semiconductor device having a zener diode, wherein an anode electrode and a cathode electrode of the zener diode have a barrier metal layer as an underlying layer, i.e., a barrier metal structure to simplify manufacturing steps of the semiconductor device, while ensuring that the zener diode is short-circuited with a low resistance without variations in resistance. The anode electrode (6) and the cathode electrode (8) are formed with an underlying metal layer made of a barrier metal. The anode electrode and the cathode electrode are shaped such that $Xa < La$ and $Xc < Lc$ are satisfied, where $Xa$ and $Xc$ are the widths of opposite sides of contact portions of the anode electrode and the cathode electrode, at which they are connected to an anode region and a cathode region, respectively, and $La$ and $Lc$ are the lengths of the respective contact portions.

17 Claims, 4 Drawing Sheets

ZENER DIODE SEMICONDUCTOR DEVICE WITH CONTACT PORTIONS

BACKGROUND OF THE INVENTION

The present invention relates generally to a semiconductor device, and more particularly to a semiconductor device having a zener diode.

In a semiconductor device, such as for example, a semiconductor integrated circuit, a zener zap method is employed, for example, as a method of trimming a circuit constant. The zener zap method trims a circuit constant in the following manner. First, a zener diode is inserted into an integrated circuit such that a reverse bias can be applied the zener diode, and an open circuit portion is constructed in which a leak current flows only through the zener diode. The zener diode is reverse biased, i.e., applied with a high current pulse of several tens of microamperes (mA) as a reverse overcurrent, as required, to short or destroy the zener diode between the anode and the cathode thereof to bring the open circuit portion into a conductive state, thereby trimming the circuit constant.

The zener diode may be formed, for example, from an npn transistor, the emitter region of which serves as a cathode region, and the base region of which serves as an anode region. A metal layer of Al or Al alloy containing approximately 1% of Si, Cu or the like is ohmic contacted on each of these regions to form a cathode electrode and an anode electrode for the zener diode.

The destructively shorted zener diode causes the above-mentioned reverse overcurrent to conduct through a p-n junction between the anode and the cathode thereof, resulting in an increased temperature. Further, a local temperature rise, i.e., the occurrence of a hot spot due to non-uniform distribution of impurities, crystal defects, non-uniform heat dissipation, and so on causes current concentration which gives rise to an instantaneous and local temperature rise as well as the occurrence of a low resistance region and a destroyed junction associated therewith. The migration of Al atoms from the electrodes caused by a subsequent current due to the destroyed junction forms a filament between the anode and the cathode on the surface of the semiconductor, creating short-circuit between the anode and the cathode.

In recent years, by the way, electrodes and wires have been increasingly thinner in response to demands for higher density and further reduction in size of a semiconductor integrated circuit, and correspondingly, each semiconductor region of an electrode in a circuit element thereof, for example, a transistor, is required to have a lower contact resistance. With the required reduction in contact resistance, when an electrode metal layer made of Al or an alloy including Al is used as an electrode, it is necessary to avoid an increased resistance due to an reaction of Al with Si contained in a semiconductor during a heat treatment or the like in a semiconductor manufacturing process. For this purpose, a so-called barrier metal layer made of a refractory or high melting point metal such as, for example, Ti, TiON or the like acts as an underlying layer for the electrode to eliminate the reaction.

However, if the electrode having the arrangement mentioned above is applied to a zener diode, the barrier metal tends to prevent Al from migrating into a semiconductor in destructive short and adversely affects the formation of a filament between the cathode and the anode. Therefore, an extremely large pulse current is required for the destructive short. In addition, a filament thus formed tends not to have a sufficiently reduced resistance.

To eliminate the inconvenience mentioned above, a zener diode has been proposed in which the formation of an underlying metal layer with a barrier metal layer is avoided, for example, only in an anode electrode of the zener diode.

However, when part of the electrodes is formed without the barrier metal structure while the remaining electrodes are formed with the barrier metal structure, the number of manufacturing steps thereof is increased so that the mass productivity is degraded.

SUMMARY OF THE INVENTION

It is an object of the present invention to provide a semiconductor device having a zener diode in which an anode electrode and a cathode electrode are all formed in a so-called barrier metal structure having a barrier metal layer as an underlying metal layer to simplify manufacturing steps, while ensuring that the short-circuit in the zener diode occurs with a low resistance without incurring variations in resistance.

The present invention provides a semiconductor device having a zener diode, where the anode electrode and the cathode electrode of the zener diode are formed with an underlying metal layer made of a barrier metal, and the anode electrode and the cathode electrode are constructed such that $Xa < La$ and $Xc < Lc$ are satisfied, where $Xa$ and $Xc$ are the widths of opposing sides of contact portions of the anode electrode and the cathode electrode with an anode region and a cathode region, respectively, and $La$ and $Lc$ are the lengths of the respective contact portions.

A difference between the respective widths $Xa$ and $Xc$ of opposing sides of the contact portions of the anode electrode and the cathode electrode is set to be within $\pm 1.2\ \mu m$.

A difference $\Delta S$ between areas $Sa$ and $Sc$ of the contact portions of the anode electrode and the cathode electrode is within $\pm 25\%$ relative to both the areas $Sa$ and $Sc$.

The widths $Xa$ and $Xc$ of the opposing sides of the contact portions of the anode electrode and the cathode electrode are chosen to be in a range of $0.7\ \mu m$ to $2.2\ \mu m$, respectively.

In the present invention, as mentioned above, in spite of the fact that the anode electrode and the cathode electrode are both formed in a structure without relying on a so-called barrier metal structure, a particularly selected shape for the anode electrode and the cathode electrode ensures the formation of a low resistance filament on the surface of a semiconductor substrate between the anode and the cathode to cause short-circuit destruction of the zener diode without requiring a larger reverse current.

DESCRIPTION OF THE PREFERRED EMBODIMENTS

An embodiment of the semiconductor device according to the present invention will hereinafter be described with reference to the accompanying drawings.

Figure 1:
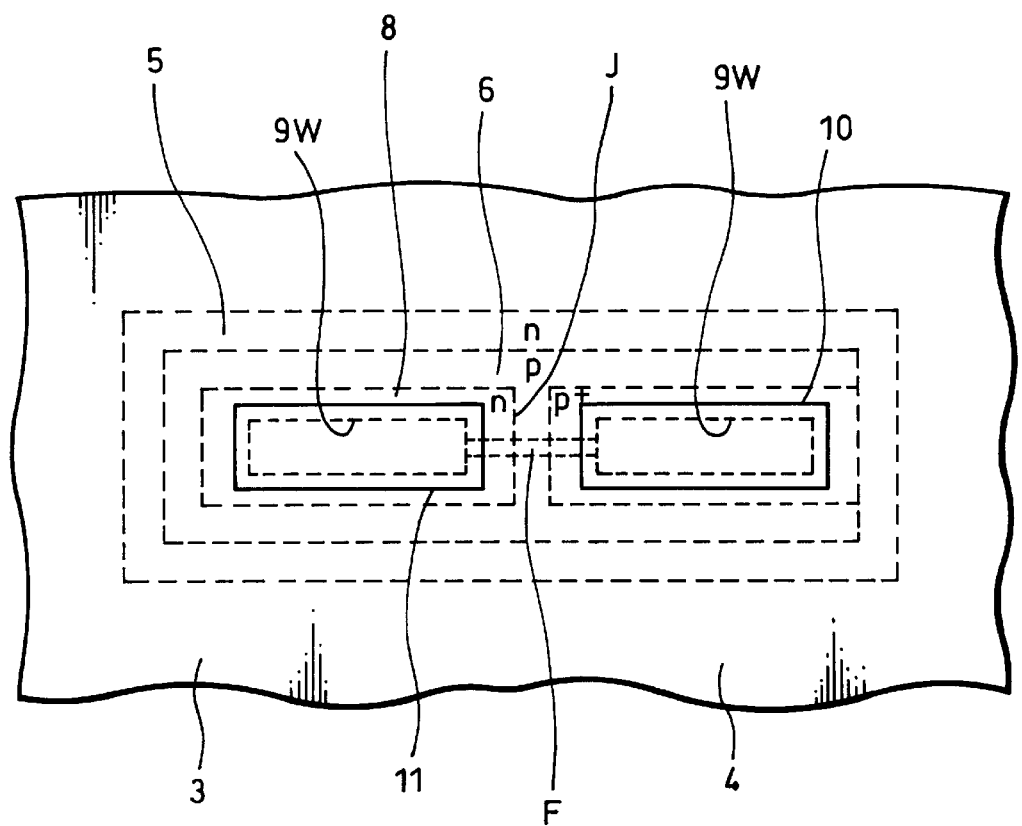
FIG. 1 is a schematic plan view illustrating a main portion of an example of the semiconductor device according to the present invention.
Figure 2:
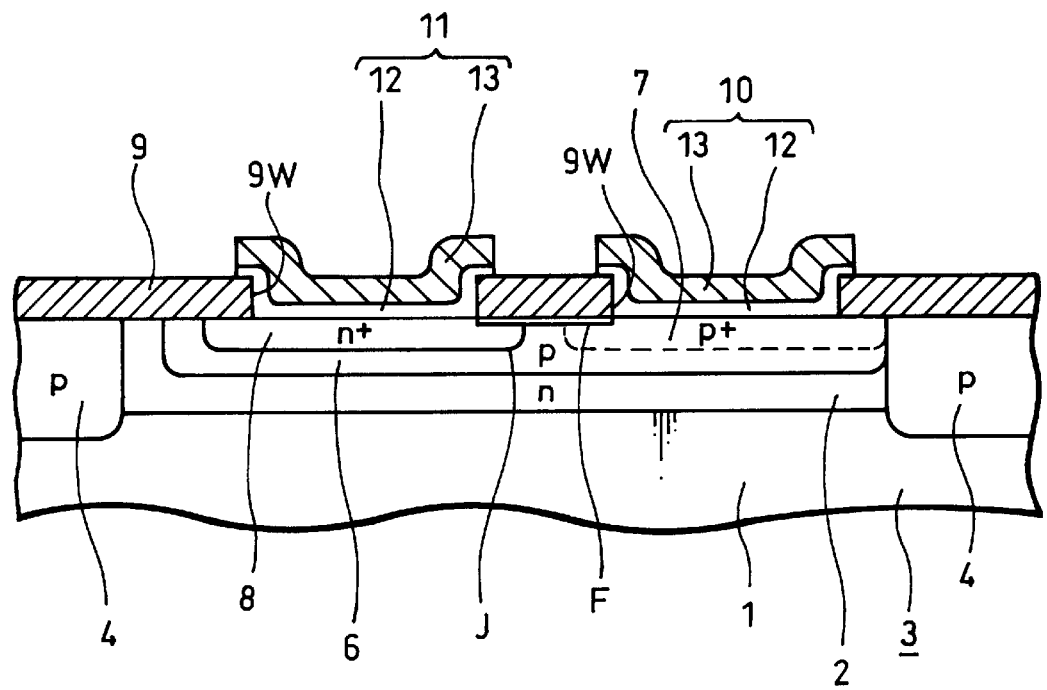
FIG. 2 is a schematic cross-sectional view of the main portion of the example of the semiconductor device according to the present invention.

FIG. 1 is a plan view illustrating an example of a zener diode portion in a semiconductor device, for example, a semiconductor integrated circuit according to the present invention, and FIG. 2 illustrates a cross-sectional view of the structure shown in FIG. 1.

Assume in this embodiment that a zener diode is formed in an npn-type silicon transistor configuration.

In this case, a semiconductor substrate 3 is prepared which has formed thereon an epitaxially grown semiconductor layer 2 made of an n-type Si on a semiconductor base 1 made, for example, of a p-type Si.

In the semiconductor substrate 3, a p-type isolation region 4 for mutually separating a zener diode and other circuit elements is formed, for example, by diffusion, ion implantation or the like of a p-type impurity across the semiconductor layer 2.

A portion of the semiconductor layer 2 surrounded by the isolation region 4 is a region corresponding a collector region 5 of an npn-type transistor. A p-type anode region 6 corresponding to a p-type base region is formed in the collector region 5 by diffusion, ion implantation or the like of a p-type impurity. Further, on the anode region 6, an electrode extracting region 7 facing the surface of the semiconductor substrate 3 is formed by diffusion, ion implantation or the like of a p-type impurity. Furthermore, with a predetermined spacing maintained from the electrode extracting region 7, an n-type impurity is introduced by diffusion, ion implantation or the like to form a cathode region 8 facing the similar surface of the semiconductor substrate 3, by a region corresponding to an emitter region of a transistor.

On the surface of the semiconductor substrate 3, an insulating layer made of $SiO_2$ or the like is formed by a CVD (chemical vapor deposition) method or the like, and a contact window 9W for an electrode is formed through the insulating layer 9 on the electrode extracting region 7 on the anode region 6 and on the cathode region 8, respectively, by pattern etching using, for example, photolithography.

Then, an anode electrode 10 and a cathode electrode 11 are ohmic contacted, respectively, on the electrode extracting region 7 and on the cathode region 8 through the contact windows 9W.

The electrodes 10, 11 are formed, for example, by sputtering or the like an underlying layer 12 made of a refractory or high melting point metal such as Ti, TiON, W or the like over the entire surface, then sputtering or the like an electrode metal layer 13 made of Al or Al alloy containing Al and approximately 1% of additional Si, Cu or the like over the entire underlying layer 12, and subsequently etching the electrode metal layer 13 and the underlying layer 12 beneath the electrode metal layer 13 into a required pattern using, for example, lithography. In this way, the electrodes 10, 11 can be simultaneously formed.

In the manner described above, the zener diode is constructed in which the anode region 6 and the cathode region 8 are formed in place, respectively, and the peripheral edge of a p-n junction J between these regions is formed facing the surface of the semiconductor substrate 3.

It goes without saying that an npn-type transistor constituting the zener diode may be formed simultaneously with npn-type transistors, for example, as other circuit elements, (not shown), constituting the semiconductor integrated circuit.

Figure 3:
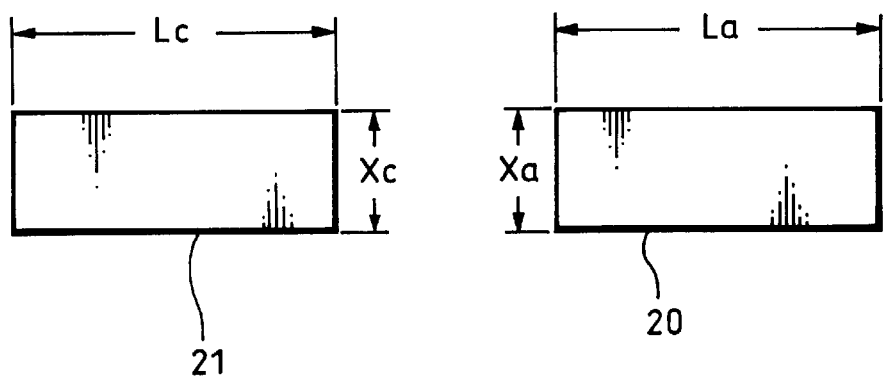
FIG. 3 is a plan view illustrating a planar relative positioning pattern of contact portions of an anode region and a cathode region of an anode electrode and a cathode electrode in an example of the semiconductor device according to the present invention.

Then, in the present invention, the anode electrode 10 and the cathode electrode 11 of the zener diode include contact portions 20, 21 which have widths Xa, Xc of their opposing sides chosen to be smaller than lengths La, Lc of the respective contact portions 20, 21, i.e., Xa<La, and Xc<Lc, respectively, as can be seen from a planar relative positioning pattern, illustrated in FIG. 3, of the contact portion 20 and the contact portion 21 connected to the anode region 6 (the electrode extracting region 7 formed in the anode region 6 in the illustrated example) and to the cathode region 8, respectively.

A difference between the widths Xa and Xc of the opposing sides of the contact portion 20 and 21 of the anode electrode 10 and the cathode electrode 11, i.e., Xa−Xc is set to be within ±1.2 μm.

A difference ΔS between areas Sa and Sc of the contact portions 20 and 21 of the anode electrode 10 and the cathode electrode 11 is set to be within ±25% relative to both the areas Sa and Sc.

The widths Xa and Xc of the opposing sides of the contact portion 20 and 21 of the anode electrode 10 and the cathode electrode 11 are chosen to be in a range of 0.7 μm to 2.2 μm, respectively.

In the example illustrated in FIGS. 1 and 3, the anode electrode 10 and the cathode electrode 11 are both made in a rectangular shape, and the contact portions 20, 21 of these electrodes 10, 11 are also made in a rectangular shape, wherein the underlying metal layer 12 has a thickness chosen to be in a range of 100 nm to 200 nm, for example, 130 nm. At this time, a filament F extending across the p-n junction J between the anode and the cathode is stably formed by applying a reverse overcurrent between the anode electrode 10 and the cathode electrode 11, with a width of 0.5 μm or more, for example, 1 μm, as illustrated in FIG. 1.

The zener diode constructed according to the present invention has an arrangement selected such that Xa<La and Xc<Lc are satisfied as mentioned above, so that its contact areas can be made sufficiently large. In addition, even with the widths Xa and Xc of the opposing sides of the contact portions 20 and 21 of the electrodes 10 and 11 being selected to be small values in a range of 0.7 μm to 2.2 μm, it is possible to avoid damaging the electrodes even if a large current of several mA to several tens of mA for short-circuiting the zener diode, i.e., forming the filament F is applied to the electrodes 10 and 11.

Further, since the widths Xa and Xc of the opposing sides of the contact portions 20 and 21 of the electrodes 10 and 11 are selected to be small values in a range of 0.7 μm to 2.2

μm as mentioned above, a current conducting between both the electrodes can be sufficiently concentrated, and hence the migration of Al atoms from the electrode metal layer, and accordingly the formation of the filament F can be achieved without failure on the surface of the semiconductor substrate.

Assuming that a target value for the sum of a mean value x and a standard deviation σ multiplied by three (x+3σ) of an on-resistance value after a destructive short by the formation of the filament F of the zener diode is equal to or less than 100 Ω, the construction according to the present invention can achieve this target.

Figure 4:
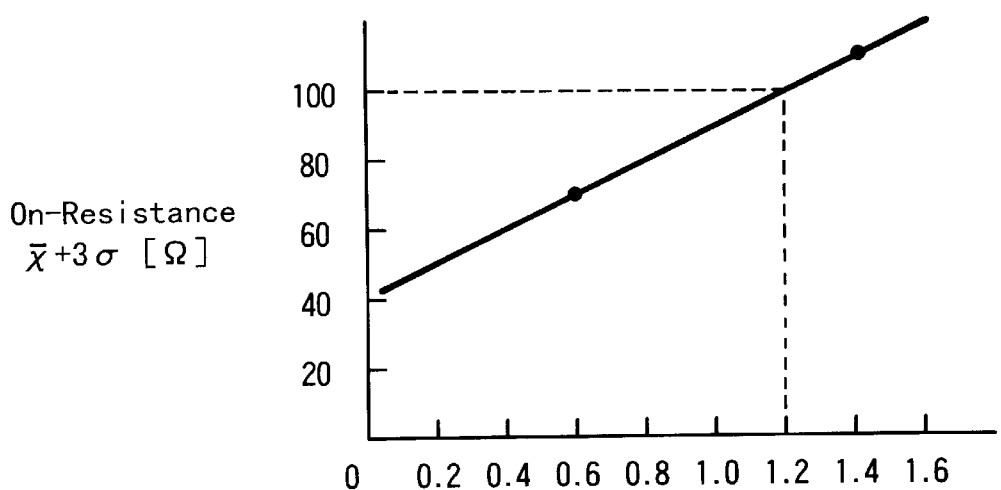
FIG. 4 is a graph showing the results of measurements on the dependency of variations in an on-resistance on the difference between the widths of opposing sides of respective contact portions of an anode electrode and a cathode electrode.
Figure 5:
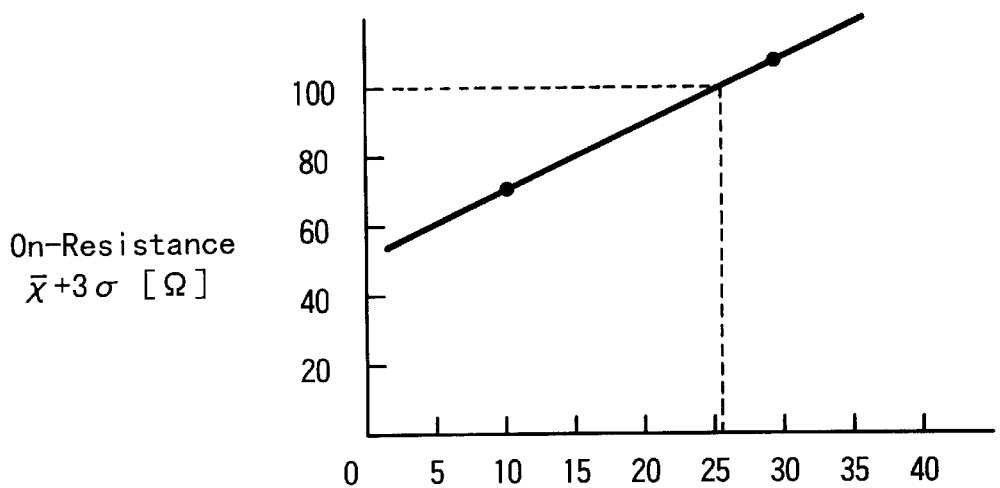
FIG. 5 is a graph showing the results of measurements on the dependency of variations in the on-resistance on the difference between the areas of the respective contact portions of the anode electrode and the cathode electrode.
Figure 6:
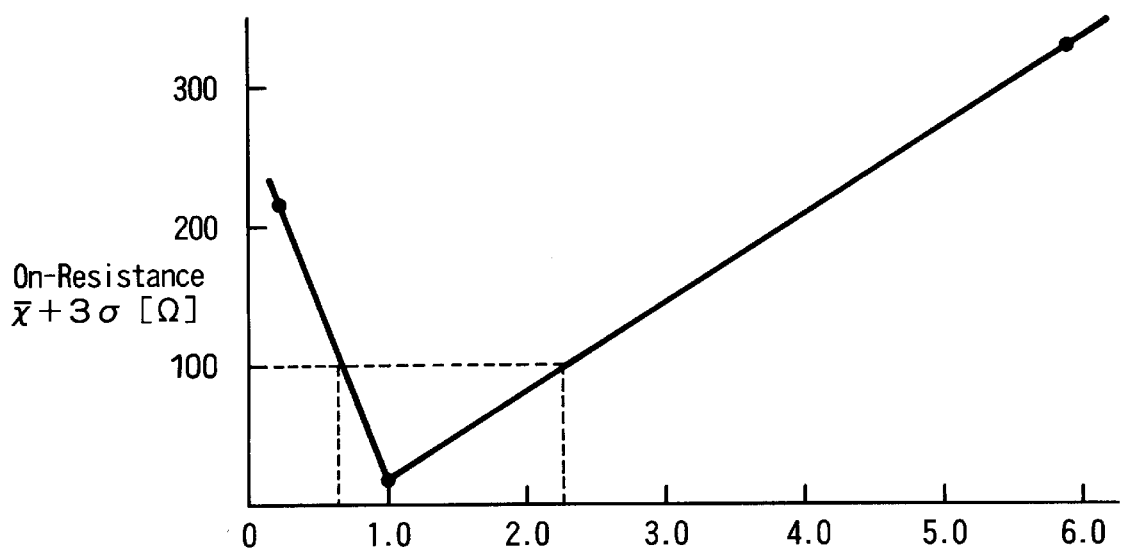
FIG. 6 is a graph showing the results of measurements on the dependency of variations in the on-resistance on the widths of the opposing sides of the respective contact portions of the anode electrode and the cathode electrode.

Specifically, FIGS. 4, 5, 6 illustrate variations of (x+3σ) with respect to the difference between the widths Xa and Xc of the anode electrode 10 and the cathode electrode 11, variations of (x+3σ) with respect to the difference between the respective areas of the anode electrode and the cathode electrode, and variations of (x+3σ) observed when changing the widths of the anode electrode and the cathode electrode, with the anode electrode and the cathode electrode having the same width, wherein the anode electrode 10 and the cathode electrode 11 are both in a barrier metal structure, and the underlying metal layer 12 is made to have a thickness of 130 nm in the aforementioned construction according to the present invention.

As is apparent from FIGS. 4 to 6, it is understood that the sum ($\overline{x}$+3σ) of the mean value $\overline{x}$ of the on-resistances and the standard deviation σ multiplied by three of an on-resistance value can be made below 100Ω, by making Xa–Xc within ±1.2 μm, making the difference between the respective areas Sa and Sc within 25%, and selecting the respective widths Xa and Xc in a range of 0.7 μm to 2.2 μm, as mentioned above.

The zener diodes according to Embodiments 1 and 2 of the present invention constructed as described with reference to FIGS. 1–3 and comparison examples 1 and 2 for purposes of comparing with the present invention are formed on the same semiconductor substrate 3, where respective cathode electrodes, anode electrodes and contact portions are made in rectangular shapes, with the widths of their opposing sides being designated by Xc and Xa, and lengths thereof by Lc and La. Forty of such samples are fabricated, and a filament F is formed to perform destructive short for each of the diodes by conducting a reverse overcurrent therethrough. Table 1 below shows the results of measurements of mean values x of on-resistances, their standard deviations σ, and (x+3σ). In each example, the spacing between the contact portions 20 and 21 of both of the electrodes is selected to be in a range of 2 μm to 3 μm. The ratio of ΔS in Table 1 indicates the ratio of ΔS to the smaller one of the areas Sc and Sa of the cathode electrode and the anode electrode, i.e., (ΔS/Sc)×100 [%] when Sc<Sa, while (ΔS/Sa)×100 [%] when Sa<Sc.

TABLE 1

| | Electrode Size (μm) | | | | Ratio of ΔS (%) | On-Resistance (Ω) | | |
|---|---|---|---|---|---|---|---|---|
| | cathode | | anode | | | Mean Value | Standard Deviation | |
| | Xc | Lc | Xa | La | | $\overline{X}$ | σ | $\overline{X}$ + 3σ |
| Embodiment 1 | 0.2 | 5.8 | 0.8 | 1.6 | 10 | 37.856 | 10.790 | 70.226 |
| Comparative Example 1 | 0.2 | 5.8 | 1.6 | 0.8 | 10 | 48.533 | 20.501 | 110.036 |

TABLE 1-continued

| | Electrode Size (μm) | | | | Ratio of ΔS (%) | On-Resistance (Ω) | | |
|---|---|---|---|---|---|---|---|---|
| | cathode | | anode | | | Mean Value | Standard Deviation | |
| | Xc | Lc | Xa | La | | $\overline{X}$ | σ | $\overline{X}$ + 3σ |
| Embodiment 2 | 0.2 | 5.8 | 0.8 | 1.6 | 10 | 37.856 | 10.790 | 70.226 |
| Comparative Example 2 | 0.2 | 8.2 | 0.8 | 1.6 | 28 | 41.696 | 21.178 | 105.23 |

As is apparent from a comparison of Embodiment 1 with Comparison Example 1, even if the areas of their respective cathode electrodes and anode electrodes are made constant, Embodiment 1, in which the electrode sizes are selected to satisfy Xa<La and Xc<Lc, has a smaller standard deviation σ, i.e., smaller variations of the on-resistance than Comparison Example, 1 which does not select such a relationship.

Also, as is apparent from a comparison of Embodiment 2 with Comparison Example 2, when the area ratio of the cathode electrode to the anode electrode is excessively large, the standard deviation σ of the on-resistance becomes correspondingly larger.

Figure 7:
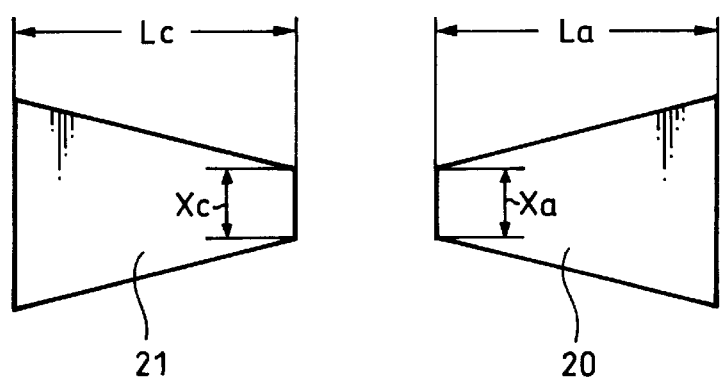
FIG. 7 is a plan view illustrating a planar relative positioning pattern of contact portions of an anode region and a cathode region of an anode electrode and a cathode electrode in another example of the semiconductor device according to the present invention.

In the structure described above, the anode electrode 10 and the cathode electrode 11 have their contact portions 20 and 21 made in rectangular patterns. The contact portions, however, are not limited to such a shape, and alternatively, a variety of shapes may be employed, for example, as illustrated in FIG. 7 which shows another planar relative positioning pattern where the contact portions 20 and 21 each have a trapezoidal pattern with their opposing sides being narrower.

Also, while in the foregoing example, the zener diode is implemented by an npn-type transistor structure, the zener diode may be formed of a p-n junction of a pnp-type transistor and so on.

According to the present invention as described above, the formation of the filament F, i.e., the destructive short of the zener diode, can be accomplished without failure in spite of the fact that the anode electrode and the cathode electrode are both formed in it structure having a barrier metal, i.e., a structure formed with the underlying metal layer 12 made of a refractory or high melting point metal.

According to the present invention as described above, since the formation of a filament F, i.e., the destructive short of a zener diode, can be accomplished without failure in spite of the fact that the anode electrode and the cathode electrode are both formed in a structure having a barrier metal, i.e., a structure formed with an underlying metal layer made of a refractory or high melting point metal, it is possible to avoid a structure which has a portion of electrodes for which a barrier metal, i.e., an underlying metal layer made of a refractory or high melting point metal is not formed. It is therefore possible to eliminate complicated manufacturing steps for preventing a barrier metal, i.e., an underlying metal layer made of a refractory high melting point metal from being formed beneath a portion of electrodes, as described above, thereby making it possible to realize an improved mass productivity and a reduced cost.

Having described preferred embodiments of the present invention with reference to the accompanying drawings, it is to bia understood that the present invention is not limited to the above-mentioned embodiments and that various changes and modifications can be effected therein by one skilled in the art without departing from the spirit or scope of the present invention as defined in the appended claims.

What is claimed is:

1. A semiconductor device having a zener diode, comprising:
   a cathode electrode, said cathode electrode forming a part of said zener diode and being connected to a cathode region at a first contact portion; and
   an anode electrode, said anode electrode forming a part of said zener diode and being connected to an anode region at a second contact portion,
   said cathode electrode and said anode electrode being connected to said first and second contact portions, respectively, such that Xa<La and Xc<Lc are satisfied, wherein Xa is a width of a side of said first contact portion opposite said second contact portion, Xc is a width of a side of said second contact portion opposite said first contact portion, La is a length of said first contact portion, and Lc is a length of said second contact portion.

2. A semiconductor device according to claim 1, wherein $|Xa-Xc| \leq 1.2$ ($\mu$m) is satisfied.

3. A semiconductor device according to claim 1, wherein $\Delta S/Sa \leq 0.25$, and $\Delta S/Sc \leq 0.25$ are satisfied, where Sa is an area of said first contact portion, Sc is an area of said second contact portion, and $\Delta S=|Sa-Sc|$.

4. A semiconductor device according to claim 1, wherein said Xa and Xc are each selected in a range of 0.7 $\mu$m to 2.2 $\mu$m.

5. A semiconductor device according to claim 1, wherein a spacing between said anode electrode and said cathode electrode is selected in a range of 2 $\mu$m to 3 $\mu$m.

6. A semiconductor having a zener diode, comprising:
   a cathode electrode, said cathode electrode forming a part of said zener diode and having an underlying metal layer formed of a barrier metal layer; and
   an anode electrode, said anode electrode forming a part of said zener diode and having an underlying metal layer formed of a barrier metal layer,
   wherein said cathode electrode is connected to a cathode region of said zener diode at a first contact portion and said anode electrode is connected to an anode region of said zener diode at a second contact portion, respectively, such that Xa<La and Xc<Lc are satisfied, wherein Xa is a width of a side of said first contact portion opposite said second contact portion, Xc is a width of a side of said second contact portion opposite said first contact portion, La is a length of said first contact portion, and Lc is a length of said second contact portion.

7. A semiconductor device according to claim 6, wherein $|Xa-Xc| \leq 1.2$ ($\mu$m) is satisfied.

8. A semiconductor device according to claim 6, wherein $\Delta S/Sa \leq 0.25$, and $\Delta S/Sc \leq 0.25$ are satisfied, where Sa is an area of said first contact portion, Sc is an area of said second contact portion, and $\Delta S=|Sa-Sc|$.

9. A semiconductor device according to claim 6, wherein said Xa and Xc are each selected in a range of 0.7 $\mu$m to 2.2 $\mu$m.

10. A semiconductor device according to claim 6, wherein said underlying metal layer has a thickness ranging from 100 nm to 200 nm.

11. A semiconductor device according to claim 6, wherein a spacing between said anode electrode and said cathode electrode is selected in a range of 2 $\mu$m to 3 $\mu$m.

12. A semiconductor device according to claim 6, wherein said contact portions each have a rectangular shape.

13. A semiconductor device according to claim 6, wherein said contact portions each have a quadrangular shape.

14. A semiconductor device according to claim 6, wherein said barrier metal layer is made of Ti, TiON or W.

15. A semiconductor device according to claim 6, wherein said anode electrode and said cathode electrode mainly contain Al, and at least Si or Cu is included in said electrodes.

16. A semiconductor device according to claim 1, wherein said contact portions each have a rectangular shape.

17. A semiconductor device according to claim 1, wherein said contact portions each have a quadrangular shape.

* * * * *